United States Patent
Katzir et al.

(10) Patent No.: US 8,335,999 B2
(45) Date of Patent: Dec. 18, 2012

(54) SYSTEM AND METHOD FOR OPTICAL SHEARING

(75) Inventors: Yigal Katzir, Rishon Lezion (IL); Elie Meimoun, Jerusalem (IL)

(73) Assignee: Orbotech Ltd., Yavne (IL)

( * ) Notice: Subject to any disclaimer, the term of this patent is extended or adjusted under 35 U.S.C. 154(b) by 150 days.

(21) Appl. No.: 12/813,888

(22) Filed: Jun. 11, 2010

(65) Prior Publication Data

US 2011/0304835 A1 Dec. 15, 2011

(51) Int. Cl.
*G06F 17/50* (2006.01)

(52) U.S. Cl. ............................ 716/50; 716/53; 716/55

(58) Field of Classification Search .................. 716/53, 716/55, 50; 355/67–71
See application file for complete search history.

(56) References Cited

U.S. PATENT DOCUMENTS

| | | | |
|---|---|---|---|
| 5,208,818 A | 5/1993 | Gelbart et al. | |
| 5,270,792 A | 12/1993 | Snyder | |
| 5,453,778 A | 9/1995 | Venkateswar et al. | |
| 5,459,492 A | 10/1995 | Venkateswar | |
| 5,699,168 A | 12/1997 | Venkateswar | |
| 5,719,682 A | 2/1998 | Venkateswar | |
| 5,721,622 A | 2/1998 | Venkateswar | |
| 5,841,956 A | 11/1998 | Venkateswar et al. | |
| 5,923,426 A | 7/1999 | Perchak | |
| 6,425,669 B1 | 7/2002 | Mei et al. | |
| 6,537,738 B1 | 3/2003 | Mei et al. | |
| 6,576,384 B1 * | 6/2003 | Lin | 430/30 |
| 6,903,798 B2 | 6/2005 | Shirota | |
| 7,136,087 B2 | 11/2006 | Okuyama et al. | |
| 7,295,362 B2 | 11/2007 | Meisburger | |
| 2003/0133626 A1 | 7/2003 | Kuramoto | |
| 2005/0190376 A1 | 9/2005 | Wegmann et al. | |
| 2005/0225788 A1 | 10/2005 | Katayama et al. | |
| 2005/0225859 A1 | 10/2005 | Latypov et al. | |

(Continued)

FOREIGN PATENT DOCUMENTS

EP 636997 2/1995

(Continued)

OTHER PUBLICATIONS

International Search Report mailed Dec. 2, 2011 for counterpart application PCT/IL11/00414.

*Primary Examiner* — Jack Chiang
*Assistant Examiner* — Mohammed Alam
(74) *Attorney, Agent, or Firm* — Sughrue Mion, PLLC

(57) ABSTRACT

A method of exposing a pattern on a light sensitive surface comprises forming a spatially modulated light beam including a rectangular matrix pattern of rows and columns of image data over a surface, wherein the spatially modulated light beam is operable to expose contiguous sub-exposure areas of the surface, each sub-exposure area associated with a datum of the image data, aligning one of the rows or columns of the spatially modulated light beam with a scan direction and the other one of the rows and columns of the spatially modulated light beam with a cross-scan direction for exposing the surface, shearing at least one portion of the modulated light beam with respect to a second portion of the modulated light beam in a cross scan direction by an amount less than a center to center distance between two sub-exposure areas in a cross scan direction, exposing the surface in the scan direction with the sheared spatially modulated light beam, and overlapping exposed sub-areas in the cross scan direction as a result of the scanning.

23 Claims, 12 Drawing Sheets

U.S. PATENT DOCUMENTS

| | | |
|---|---|---|
| 2006/0001890 A1 | 1/2006 | Poultney |
| 2006/0060798 A1 | 3/2006 | Miyagawa |
| 2009/0146081 A1* | 6/2009 | Stark .......................... 250/492.2 |
| 2010/0045958 A1* | 2/2010 | Wieland et al. ................. 355/71 |
| 2010/0060874 A1 | 3/2010 | Kim et al. |

FOREIGN PATENT DOCUMENTS

| | | |
|---|---|---|
| EP | 640488 | 3/1995 |
| EP | 750418 | 12/1996 |
| EP | 785524 | 7/1997 |
| EP | 809391 | 11/1997 |
| EP | 810775 | 12/1997 |
| EP | 875386 | 11/1998 |
| EP | 1069759 | 1/2001 |
| WO | PCT/IL2010/000320 | 4/2010 |
| WO | WO 2010/131239 A1 | 11/2010 |

* cited by examiner

SYSTEM AND METHOD FOR OPTICAL SHEARING

RELATED APPLICATION/S

The present application is related to Israel Patent Application No. 198719 filed on May 12, 2009, entitled "Optical Imaging System" which is assigned to the common assignee at the time that the invention was made and invented by the common inventors.

FIELD OF THE INVENTION

The present invention relates to maskless lithography and more particularly, but not exclusively, to spatial resolution control in maskless lithography.

BACKGROUND OF THE INVENTION

In a well known class of maskless lithography systems, a spatial light modulator (SLM) such as a Digital Micro-Mirror Device (DMD) or Grating Light Valve (GLV) or liquid crystal (LC) light valve is used for spatially modulating a beam to form an image or pattern to be printed. DMDs are SLMs in which the modulating elements are several hundred thousand microscopic mirrors arranged in a rectangular array including rows and columns. As used herein the rows and the columns in the rectangular array are defined such that the rows include more modulating elements than the columns. Each of the mirrors in the array can be individually rotated to an ON or OFF state. In the ON state, light from the light source is reflected into the optical system directing light toward the writing surface and in the OFF state, the light is directed away from the writing surface, e.g. into a light trap or heat sink.

Although DMDs are used in maskless lithography systems, they are primarily intended to be used for digital light processing projectors and rear projection televisions. The aspect ratio of the rectangular array is therefore configured for standard picture formats, e.g. television and projector screens. When employing DMDs for maskless lithography, scanning is required to accommodate imaging over an area which is typically considerably larger than an exposure area obtained from a single DMD or even from several DMDs.

Scanning is most often performed generally parallel to the column direction. Since the DMD includes a plurality of rows, scanned areas are overwritten numerous times (corresponding to the number of rows in the DMD) during each pass. Different systems and methods have been proposed to harness the plurality of rows available on the DMD for example to improve resolution, to avoid pixelation or other aliasing effects such as jagged edges in diagonal patterns, and/or to control exposure intensity.

U.S. Pat. No. 5,208,818 entitled "Laser system for recording data patterns on a planar substrate", the contents of which is incorporated herein by reference, describes a phototool generator that uses a pulsed excimer laser to image a DMD onto a substrate. The excimer laser typically has a Gaussian or trapezoidal beam profile that results in non-uniform exposure on the substrate. The uniformity of the exposure obtained with the excimer laser is improved by using an overlap method in which each spot is exposed four times with a slight two dimensional shift between exposures, so that the resulting summation of the exposure is uniform. Overlapping or overwriting is performed by a step and repeat process where precision stages are shifted at the end of each scan. One of the undesirable features of such a step and repeat process is that it requires multiple laterally shifted scanning.

U.S. Pat. No. 6,425,669 entitled "Maskless Exposure System", the contents of which is incorporated herein by reference, describes a photolithography system and method for writing a pattern generated from a pixel panel. The pixel panel typically includes a plurality of DMDs or optionally an LCD. In some embodiments, pixel elements from the pixel panel are alternately directed to a first site and then a second site that partially overlaps the first site. Overlapping at the image level provides for compensating for errors due to gaps between images or faulty pixels in the pixel panel. Additionally, overlapping at the pixel level is used for accommodating diagonal projections or non-linear structures. In one embodiment, overlapping is provided by a parallel prism, positioned in the light path between the pixel panel and wafer that offsets the image. A motor alternately positions the prism inside and outside the light path to alternate between the first and second site. Typically, such a system is specifically suitable for step and repeat exposure systems.

U.S. Pat. No. 6,537,738 entitled "System and method for making smooth diagonal components with a digital photolithography system", the contents of which is incorporated herein by reference, describes a digital photolithography system for use in making smooth diagonal components (e.g., lines and edges). A DMD provides a first digital pattern for exposure onto a plurality of wafer sites. After exposure, the wafer is displaced a distance less than the site length of the wafer. The DMD then receives a second digital pattern for exposing a second plurality of pixel elements onto the plurality of sites of the subject. The exposed second plurality of pixel elements overlaps the exposed first plurality of pixel elements. This overlapping allows incremental changes to be made in the image being exposed using a step and repeat process, thereby accommodating the creation of smooth edged diagonal components. In some embodiments, the pixel panel is angled with respect of the subject and the scan direction. As the system scans, successive pixel elements are exposed slightly offset in the y direction. Typically, substantial tilt angles that achieve only moderately dense addressing are used with such a system to ease the burden of writing data handling. This in turn mandates substantial swath overlap that is created between passes. Another known disadvantage of scanning with a tilt is that tilting typically results in non-Cartesian addressing of the scanned pixels.

U.S. Pat. No. 6,903,798 entitled "Pattern Writing Apparatus and Pattern Writing Method", the contents of which is incorporated herein by reference, describes a pattern writing apparatus for writing a pattern on a photosensitive material with a DMD. The DMD is tilted relative to the main scan direction. A center-to-center distance along the scanning direction between such two adjacent irradiation regions arranged in the main scanning direction is made equal to "a times" (a is an integer equal to or larger than 2) the pitch of writing cells on the substrate with respect to the scanning direction. This geometry determines the addressing pitch of a Cartesian addressing space. Smaller DMD rotation angles are associated with finer addressing space.

Typically, for small DMD rotations and a correspondingly finer addressing pitch, addressing uniformity becomes susceptible to optical and mechanical distortions. Furthermore, smaller DMD rotations and correspondingly finer addressing pitch in practice dictate larger "n" values. Making "n" larger does allow for higher writing speeds, but also causes "smear" (or blurring) due to the continuous motion during the active frame time. This blurring effect may be somewhat offset by turning the light source OFF before the next frame reset, at the expense of exposure energy utilization. Alternatively, higher writing speeds may be achieved while reducing the number of exposures, by using only a portion of the DMD for writing, e.g. only 192 rows of the DMD out of the 768 rows available, and the rest are permanently kept in the OFF position. This of course also results in reduced exposure energy efficiency.

U.S. Pat. No. 7,136,087 entitled "Multi-Exposure Drawing Method and Apparatus Therefore", the contents of which is incorporated herein by reference, describes an exposure unit including a DMD that is moved at a constant velocity in a drawing direction that forms a slight angle with respect to the elements of the DMD. An exposure is provided when the DMD is moved in the drawing direction by a distance of "A+a" where "A" is a distance corresponding to an integer-multiple of a distance exposed by one element of the DMD, and "a" is a fraction of a distance exposed by one element of the DMD. The inclination angle of the drawing direction and the rate of exposure can be adjusted to obtain a desired resolution. Small DMD rotations typically require long reset intervals which results in substantial motion smear. This effect is typically minimized by turning the entire DMD to an OFF state in between any two active frames. Although the motion smear is reduced in this manner, the exposure energy efficiency is likewise reduced.

U.S. Pat. No. 7,295,362 entitled "Continuous Direct-Write Optical Lithography," the contents of which is incorporated herein by reference, describes a lithographic method that includes illuminating a spatial light modulator with an area array of individually switchable elements and projecting an image of the spatial light modulator on a photosensitive surface of a substrate while moving the image across the surface of the substrate. While the image is moving, elements of the spatial light modulator are switched so that a pixel on the photosensitive surface receives, in serial, doses of energy from multiple elements of the spatial light modulator, thus forming a latent image on the surface. The image is blurred to enable sub-pixel resolution feature edge placement. The number of pixels exposed on the substrate surface in the cross scan direction during scanning corresponds to the number of elements available along a row of the spatial light modulator.

US Patent Application Publication No. 20060060798 entitled "Method and Apparatus for Multi-Beam Exposure," the contents of which is incorporated herein by reference, is in the field of planographic printing and describes a multi-beam exposure method and an apparatus for recording a stable halftone expression with sharp dot edges using an FM screen when performing the exposure process with a DMD by increasing the number of dots (the number of beam spots) which can be simultaneously exposed in a direction orthogonal to the scanning direction. The apparatus includes a pixel block shifting member to divide a plurality of exposure beam spots emitted from a DMD into a plurality of blocks in the scanning direction and shifting each pixel block with respect to another pixel block in a direction orthogonal to the scanning direction for scan-exposing a space in a direction between the exposed beam spots with the exposure beams spots of another block. Typically, the block shifting member is arranged behind and proximal to a micro-lens array on the optical path in order to focus the dots onto the recording medium. The micro-lens array provides for non-overlapping exposure beam spots. Optionally, the array of separate dots is generated using an aperture array mask in place of the micro-lens array. Optionally, the separate beam spots are further split using a polarizing element into pairs of partially overlapping spots to obtain an approximately rectangular shape.

SUMMARY OF THE INVENTION

An aspect of some embodiments of the invention is the provision of a system and method for improving and/or adjusting printing quality properties of maskless lithography systems using a DMD or other SLM for scanning, while reducing or obviating some or all of the problems associated with known tilt and step-and-repeat methods. According to some embodiments of the present invention, cross-scan resolution of a scanned pattern is controlled by optically deforming a spatially modulated light beam in a cross-scan direction. According to some embodiments of the present invention, resolution in the scan direction is concurrently controlled by controlling the amount of overlapping of consecutive exposure areas in the scanning direction.

As used herein the scan direction refers to the direction the target object advances during a single pass or swath, while the cross-scan direction refers to a direction substantially perpendicular to the scan direction. In case of multi-pass scanning, stepping between passes is typically in the cross-scan direction.

An aspect of some embodiments of the present invention provides for a method of exposing a pattern on a light sensitive surface, the method comprising: forming a spatially modulated light beam including a rectangular matrix pattern of rows and columns of image data over a surface, wherein the spatially modulated light beam is operable to expose contiguous sub-exposure areas of the surface, each sub-exposure area associated with a datum of the image data; aligning one of the rows or columns of the spatially modulated light beam with a scan direction and the other one of the rows and columns of the spatially modulated light beam with a cross-scan direction for exposing the surface; shearing at least one portion of the modulated light beam with respect to a second portion of the modulated light beam in a cross scan direction by an amount less than a center to center distance between two sub-exposure areas in a cross scan direction; exposing the surface in the scan direction with the sheared spatially modulated light beam; and overlapping exposed sub-areas in the cross scan direction as a result of the scanning.

Optionally, the contiguous sub-exposure areas form a continuously exposed area with no spacing in between.

Optionally, the shearing is applied on 2-6 blocks of contiguous rows of image data.

Optionally, the shearing is defined as 1/n of the center to center distance between contiguous sub-exposure areas, wherein 'n' is the number of blocks.

Optionally, the shearing defines a resolution in a cross-scan direction.

Optionally, the surface is exposed with Cartesian addressing.

Optionally, the spatially modulated light beam is formed from a single DMD.

Optionally, a scanning interval is defined as a non-integer multiple of an area exposed by a sub exposure area of the modulated light beam.

Optionally, the exposing interval is defined to match a resolution provided in a cross-scan direction.

Optionally, exposing includes writing.

An aspect of some embodiments of the present invention provides for a system of scanning a pattern on a surface comprising: a scanner operative to scan a surface in a scan direction; a spatial light modulator operative to provide a spatially modulated light beam including image data arranged in a matrix pattern of rows and columns, each datum operative to expose a sub-exposure area on the surface, wherein the columns are aligned with a scan direction and the rows are aligned in a cross-scan direction; an optical shearing element operative to shift at least a first portion of the matrix pattern of the image data in a cross scan direction with respect to at least a second portion by an amount less than a center to center distance between two contiguous sub-exposure areas to form a sheared matrix pattern; and an imaging system operative to expose the sheared matrix pattern on the surface as a pattern of substantially adjoining sub-exposure areas, such that sub-exposure areas from one of the first and second portion of the matrix pattern overlap sub-exposure areas of the other of the first or second portion during the scanning.

Optionally, the shearing is applied on 2-6 blocks of contiguous rows of image data.

Optionally, each block includes 192-270 contiguous rows.

Optionally, the optical shearing element includes a plurality of transparent sections that are angled with respect to each other, wherein the number of transparent sections corresponds to the pre-defined number of blocks, wherein each of the transparent sections is operative to shift one of the pre-defined blocks of image data.

Optionally, each transparent section is angled to provide a shift corresponding to 1/n of a distance between contiguous addressing points, wherein 'n' is the number of blocks of image data.

Optionally, the optical shearing element is a warped surface operative to provide linear shearing in the row direction.

Optionally, the optical shearing element is positioned proximal to the target object.

Optionally, the spatial light modulator is a DMD.

Optionally, the system comprises a controller operative to set a scanning interval in response to a desired resolution in the scan direction.

Optionally, the scanning interval is defined to match a resolution provided in a cross-scan direction.

Optionally, the scanner is operative to scan with Cartesian addressing.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

Figure 1A:
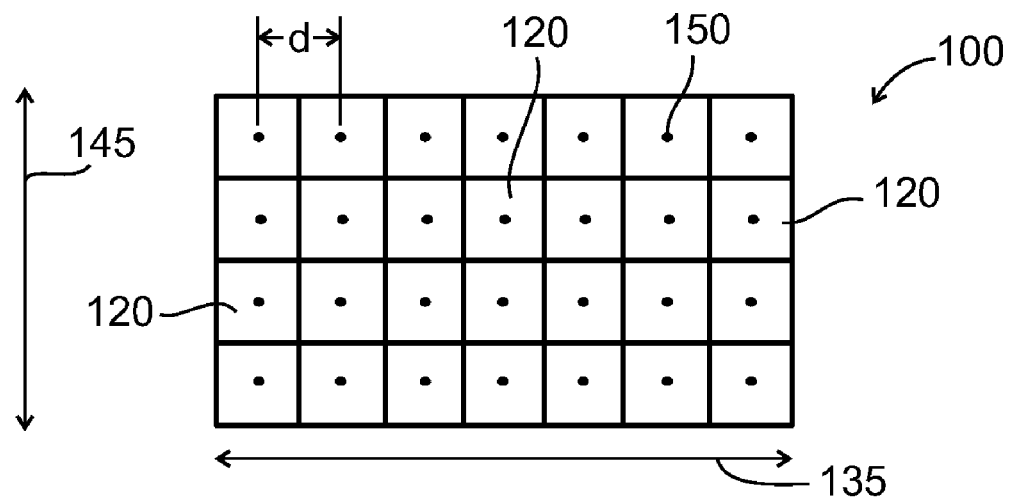
FIGS. 1A and 1B are simplified schematic diagrams of representative arrangements of image data obtained from an exemplary 4-row SLM before and after shearing in accordance with some embodiments of the present invention.

DESCRIPTION OF SPECIFIC EMBODIMENTS
OF THE INVENTION

The present invention relates to maskless lithography and more particularly, but not exclusively, to spatial resolution control in maskless lithography.

An aspect of some embodiments of the present invention provides for increasing addressing density of an exposed target surface by scanning the target surface with DMD images that are optically sheared in a cross-scan direction. According to some embodiments of the present invention, the shearing direction is aligned with the row direction of the DMD and the direction of scanning is aligned with the column direction of the DMD. In other embodiments these directions may be reversed. According to some embodiments of the present invention, an increase in address density of the DMD image results in overlapping of exposed areas. According to some embodiments of the present invention, the density of addressing is increased while maintaining an orthogonal addressing space during scanning. The increased density in addressing provides for smooth and precise patterns. Multiple overlapping exposures improve diagonal edges. A uniform number of exposures at each addressing point can be maintained to ensure pattern edge quality.

In some exemplary embodiments, the shear is imposed between discrete portions of the image, for example between defined blocks of contiguous rows of image data on the DMD. In some exemplary embodiments, the shearing (spatial shift between two adjacent portions) corresponds to a fraction of a size of an area exposed from a single element of the DMD, e.g. a fraction of an exposure area (spot size) and/or a fraction of a distance between two neighboring addressing points. According to some embodiments of the present invention, the shifted portions are defined blocks of contiguous rows on a DMD. Typically, the number of contiguous rows included in each block defines the amount of overwriting provided for each addressing point. Additionally, the number of shifted portions or blocks defines the addressing density in the cross-scan direction. Optionally, the addressing density in the cross-scan direction is increased to 2-5 addressing points per exposure area. The present inventors have found that increasing the addressing density in the cross-scan direction to 2-5 addressing points per exposure area reduces pixelation and/or aliasing effects without significantly increasing handling burden of writing data by the system electronics.

According to some embodiments of the present invention, overlapping between exposed areas in the scan direction is defined to match the overlapping in the cross-scan direction. Typically, the overlapping between exposed areas in the scan direction is increased by controlling, e.g. reducing, the reset interval between successive frames. According to some embodiments of the present invention, overlapping in the scan and cross-scan directions can be independently controlled to obtain a desired addressing density and/or overlapping between exposed areas.

According to some embodiments of the present invention, the shearing provides for altering the alignment between rows of image data from the DMD image in the cross-scan direction by a distance equal to a fraction of the DMD element size. Typically, each portion is shifted by a same amount with respect to a neighboring portion and the shift corresponds to 1/n of a DMD element size in the cross-scan direction, where 'n' is an integer. Typically 'n' corresponds to the addressing resolution increase relative to the fundamental DMD resolution. Sub-element shifting between portions of the spatially modulated beam increases the number of addressing points by 'n', and thereby the resolution in the cross-scan direction. Sub-element shifting between portions also reduces the amount of overwriting of each addressing point. Typically, as the number of addressing points is increased, the amount of overwriting of each addressing point is reduced.

It is noted that although incorporated US Publication No. 20060060798 in the field of planographic plate printing describes a discrete optical shearing method that may appear similar to that of the present invention, the purported end result of optical shearing in Publication No. 20060060798 is toward increasing the number of dots that can be exposed in the cross-scan direction while maintaining sharp dots edges. In Publication No. 20060060798 dots exposure smearing in either the scan or cross-scan directions is curbed. In contrast, in the present invention, optical shearing provides multiple overlapping exposures to obtain smooth and precise patterns for a writing system.

The present inventors have found that enhancing resolution based on the systems and methods described herein improves energy efficiency and provides high quality controllable output. High quality output, for example regarding printing diagonal patterns and edges has been discussed hereinabove. The present inventors have also found that manageability in data handling and scanning speed are also improved by shearing the exposed image. Typically, the reset interval required between successive DMD frames is directly related to the amount of overwriting from contiguous rows of the DMD.

In some exemplary embodiments, shearing the spatially modulated light beam reduces the amount of overlapping between adjacent scans while also eliminating the need for blanking periods between successive DMD frames. Eliminating the blanking periods increases the duty factor of the exposures to substantially continuous exposure and thereby increases energy efficiency. In some exemplary embodiments, elimination of the blanking periods is provided with minimum, low and/or reduced motion blur. With regard to overlapping, reduced overlapping from adjacent scans typically reduces burden in data handling. Optionally, the amount of overlapping between adjacent scans is directly controlled by defining a size of portions of the DMD images that are optically sheared with respect to other portions.

Additionally, since according to some embodiments of the present invention scanning is performed parallel to the column direction, less overlap is typically required in the cross-scan direction between adjacent DMD units or scanning swaths (passes) as compared to systems and methods that impose a tilt on the spatially modulated data during scanning. By reducing the amount of required overlapping, the number of scanning swaths required may be reduced (without increasing the number of DMD units) and thereby the scanning speed for scanning is increased.

Figure 1B:
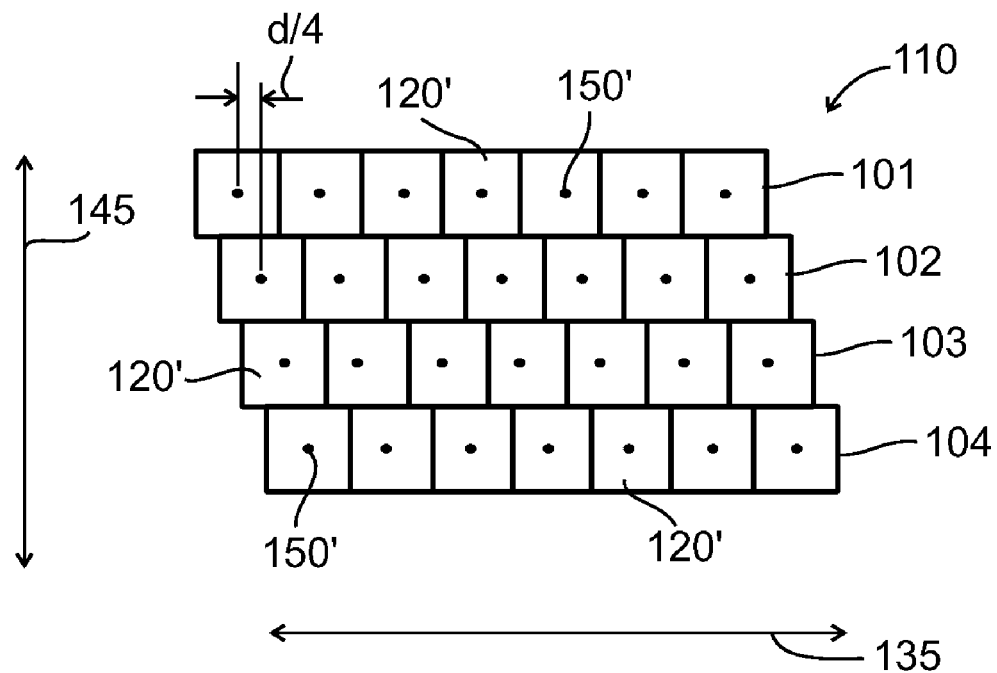

Reference is now made to FIGS. 1A and 1B showing simplified schematic diagrams of representative arrangements of image data projected from an exemplary 4-row SLM before and after shearing in accordance with some embodiments of the present invention. In FIGS. 1A and 1B an exposure pattern including only 4 rows and 7 columns is shown for simplicity of illustration. According to some embodiments of the present invention, image data from a spatially modulated light beam that is arranged in an exposure pattern 100 is optically altered to sheared matrix pattern 110. Typically, the image data is constructed from a plurality of contiguous sub-exposure areas 120 with almost no and/or substantially no spacing between them. Typically, each sub-exposure area 120 is associated with an addressing point 150 that is centered over each sub-exposure area 120. According to some embodiments of the present invention, sheared pattern 110 is obtained by optically shifting contiguous portions of matrix pattern 100, e.g. optically shifting whole rows 101, 102, 103, and 104 as shown in FIG. 1B (or whole blocks of contiguous rows, as discussed below) in a row (cross-scan) direction 135. For ease of illustration, a simplified 4 row SLM with shearing of single row blocks is shown in the drawings.

According to some embodiments of the present invention, the shift between the rows is equal to a fraction of the dimension of sub-exposure area 120 in row direction 135, e.g. a fraction of a distance 'd' between two contiguous addressing points 150 in the row direction. Typically, a same shift is imposed between each of the rows and the shift is equal to a fraction of sub exposure area 120 given by one divided by the number of shifted blocks so that the sub-exposure areas 120' and addressing points 150' are symmetrically shifted and/or evenly or uniformly distributed in the row direction and the resolution in the cross-scan direction is uniform.

For example, in FIG. 1B, exposure pattern 110 is divided into 4 portions (n=4), e.g. rows 101, 102, 103, and 104 and each of the portions is shifted with respect to each other in row direction 135 by a 1/n (1/n=¼) of sub-exposure area 120' dimension in row direction 135, e.g. d/4. In response to the shifting, all addressing points 150' are uniformly distributed in the row direction, with a resolution in the row direction that is four times that of addressing points 150 (FIG. 1A). In other exemplary embodiments, exposure pattern 110 is divided into two portions, e.g. rows 101 and 102 is a first portion and rows 103 and 104 is a second portion, and the shift between each of the portions is d/2.

For a spatial light modulator matrix including many more than four rows, other divisions and shift sizes may be used. For example, a DMD array comprising 768 rows may be divided into 4 contiguous blocks of 192 rows, each progressively shifted by ¼ of an element size. Alternatively, 765 rows may be divided into 5 blocks of contiguous rows each consisting of 153 rows, each shifted progressively by ⅕ element size. Some rows may be left blank so as to equalize the number of active rows in each block. According to some embodiments of the present invention, spatial resolution in row direction 135 is directly controlled based on the amount of shift imposed between the defined portions of image data. For example, decreasing the shift size and/or increasing the number of shifted portions, increases the spatial resolution in row direction 135. Alternatively, increasing the shift size and/or decreasing the number of portions shifted decreases the spatial resolution.

Figure 2A:
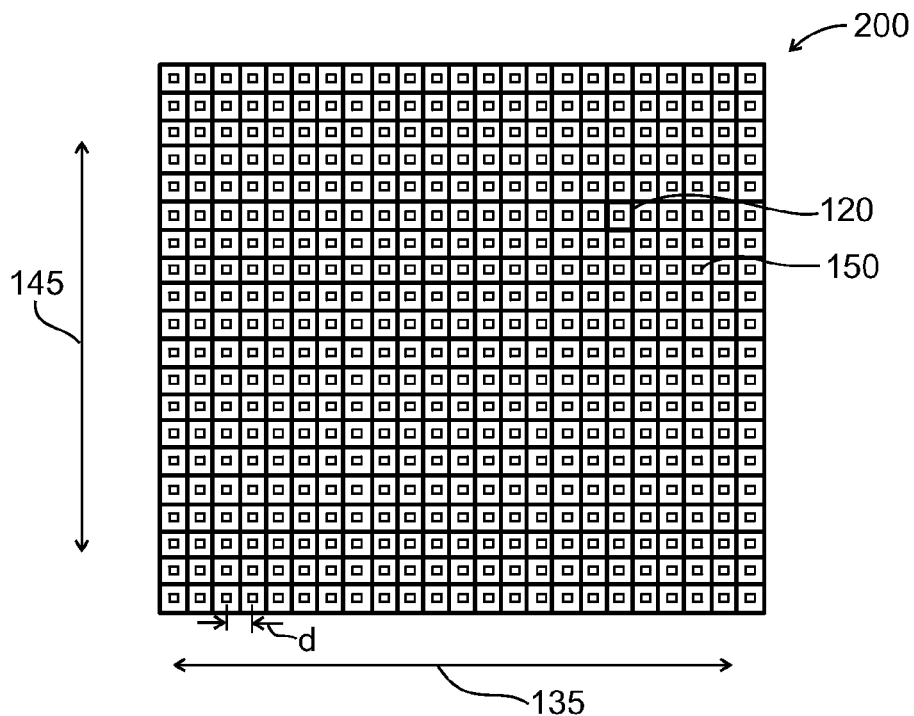
FIGS. 2A and 2B are simplified schematic diagrams of representative arrangements of image data projected from an exemplary 20-row SLM before and after shearing in accordance with some embodiments of the present invention.
Figure 2B:
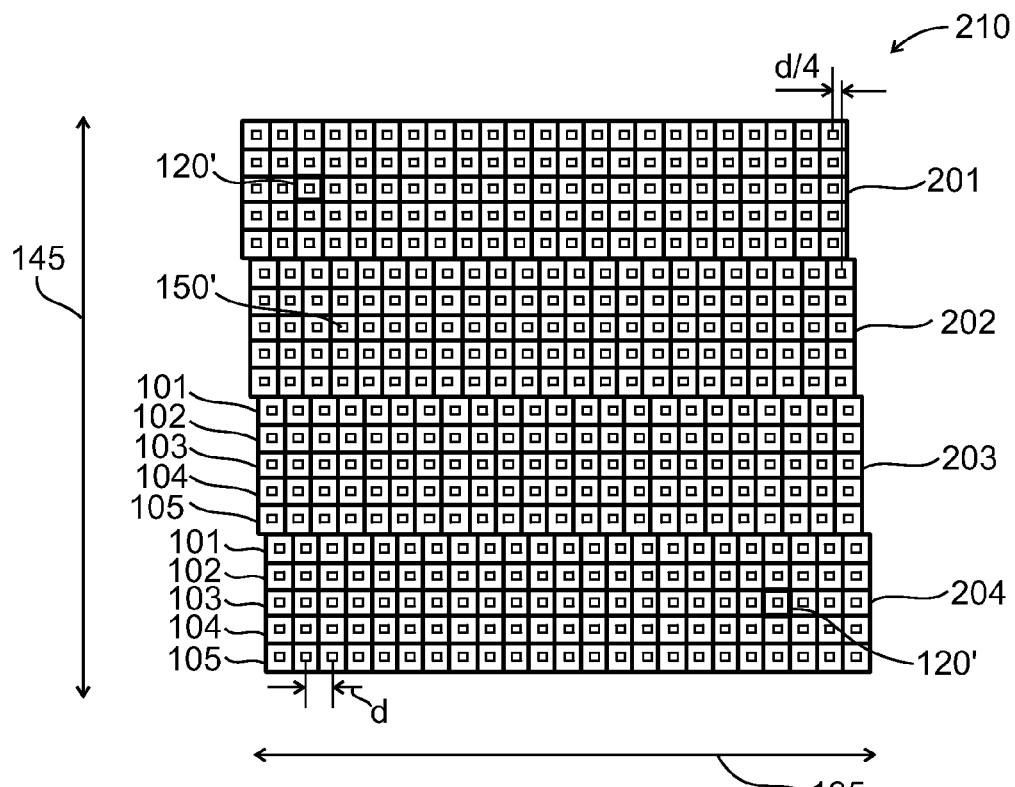

Reference is now made to FIGS. 2A and 2B showing simplified schematic diagrams of representative arrangements of image data projected from an exemplary 20-row SLM before and after shearing in accordance with some embodiments of the present invention. According to some embodiments of the present invention, image data from a spatially modulated light beam that is arranged in an exposure pattern 200 is optically altered into a sheared matrix pattern 210 including blocks of rows, e.g. blocks 201, 202, 203 and 204 that are progressively shifted in a row direction 135. Typically, each block includes a plurality of rows, e.g. rows 101, 102, 103, 104 and 105 that are aligned (not shifted) with respect to each other.

According to some embodiments of the present invention, the shift between the blocks is equal to a fraction of the dimension of sub-exposure area 120 and/or a fraction of distance, 'd', between contiguous addressing points 150. Typically, a same shift is imposed between each pair of contiguous blocks, e.g. block 201 and block 202, block 202 and block 203, block 203 and block 204. For example, in exposure pattern 210 divided into 4 blocks of rows, the shift between each pair of contiguous blocks is d/4. As a result of this exemplary shifting, addressing points 150' from different blocks are evenly distributed in the row direction, with a resolution in the row direction that is four times that of the resolution provided by exposure pattern 200. In other exemplary embodiments, exposure pattern 200 is divided into two portions, and the shift between each of the portions is ½ of the size of sub-exposure area 120 in row direction 135, e.g. d/2.

Figure 3:
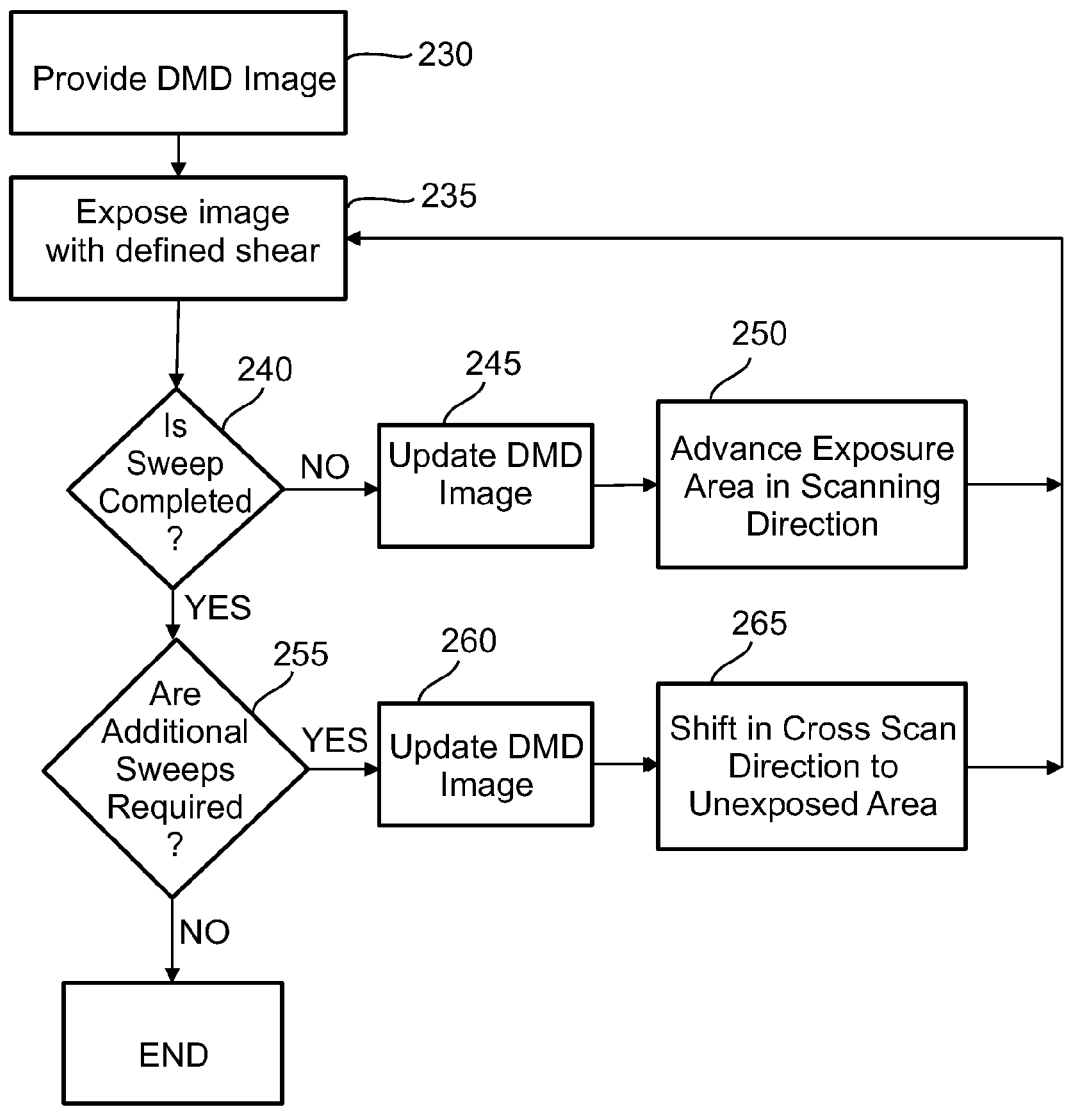
FIG. 3 is a simplified flow chart of an exemplary method for scanning a surface with sheared exposure pattern in accordance with some embodiments of the present invention.

Reference is now made to FIG. 3 showing a simplified flow chart of an exemplary method for scanning a surface with sheared exposure pattern in accordance with some embodiments of the present invention. Typically, exposure data of a pattern to be printed is provided to a DMD so as to form images, e.g. image 100 or 200 for exposure (block 230). Typically, images are provided in defined exposure intervals in response to a reset pulse provided to the DMD while scanning a target object.

According to some embodiments of the present invention, the image provided by the DMD is projected onto the target object with a defined sheared exposure pattern in the cross-scan direction (block 235), e.g. exposure pattern 110 or 210. Generally a shearing module is provided to shear the DMD image into the sheared image. Typically, the image, e.g. image data provided by the DMD is configured for shearing. According to some embodiments of the present invention, between each reset interval, the DMD image is updated (block 245) and the exposure area is advanced in the scanning direction by a pre-defined distance (block 250). In some exemplary embodiments, a subsequent exposure is provided each time the exposure area is advanced by an amount d/n equal to a shift between sheared portions of the image in the cross-scan direction to produce an exposure addressing grid having a same resolution (distance between neighboring addressing points) along the scan and cross-scan directions. Other reset intervals producing equal scan and cross-scan addressing resolution are also possible. For example, in the 4-block case shown in FIG. 2B a reset interval equal to 3d/4 or some other odd multiple of d/4 produces equal addressing resolution in the scan and cross-scan directions. Optionally, a same resolution in the scan and cross-scan direction is provided by exposing a subsequent exposure each time the exposure area is advanced by d*(M+1/n), where M is 0 or some integer. Other embodiments of the invention may employ different reset intervals, for example producing non-equal scan and cross-scan resolution if needed for certain applications. Typically, this process is continued until a sweep of the target object is completed (block 240). If additional sweeps (swaths) are required to scan unexposed areas (block 255), the DMD image is updated (block 260), the exposed area is shifted in a cross-scan direction to an unexposed area (block 265) and an additional sweep, this time typically in the reverse direction, is initiated. Typically, some swath overlap is provided between sweeps. Swath overlap can be used to compensate for tolerances in alignment. Typically the overall footprint of a single SLM image is in the range of 10 to 60 mm, and the amount of swath overlap is typically in the range of 0.1 to 1 mm, depending on the number of row elements of the SLM employed and the printing resolution. Alternatively, in other embodiments of the invention multiple SLM devices or optically partitioned SLM devices are used to span the entire width of the substrate, as described in International Patent Application No. PCT/IL2010/000320 filed on Apr. 22, 2010, the content of which is incorporated herein by reference. In such embodiments the substrate may be scanned in a single sweep with no need for cross-scan movement.

Figure 4A:
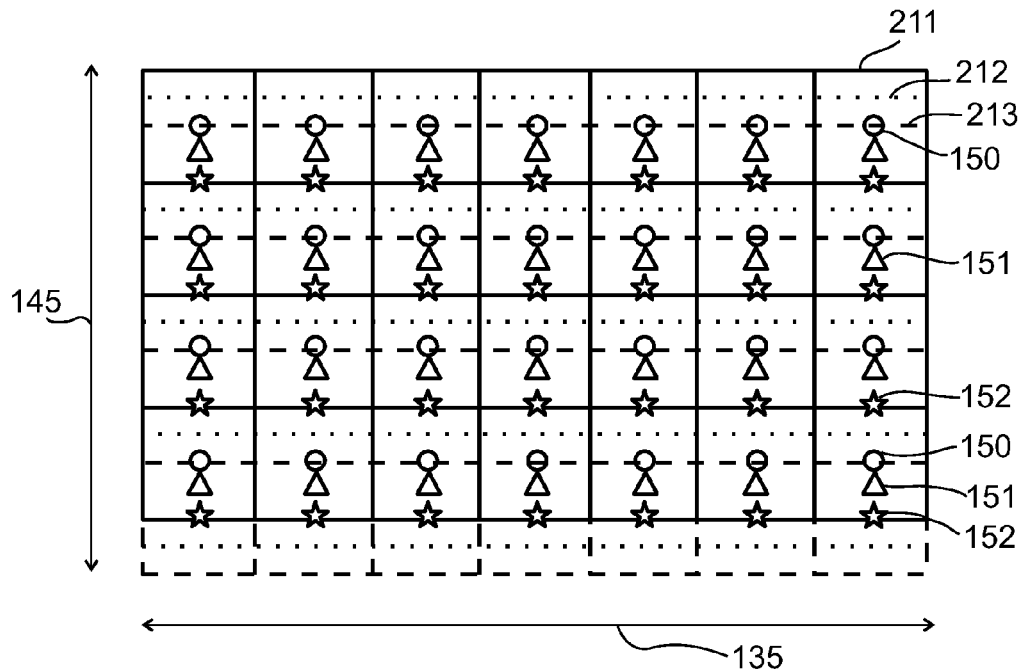
FIGS. 4A and 4B are simplified schematic diagrams comparing a known rectangular addressing grid and a sheared addressing grid obtained from three consecutive exposures in accordance with some embodiments of the present invention.
Figure 4B:
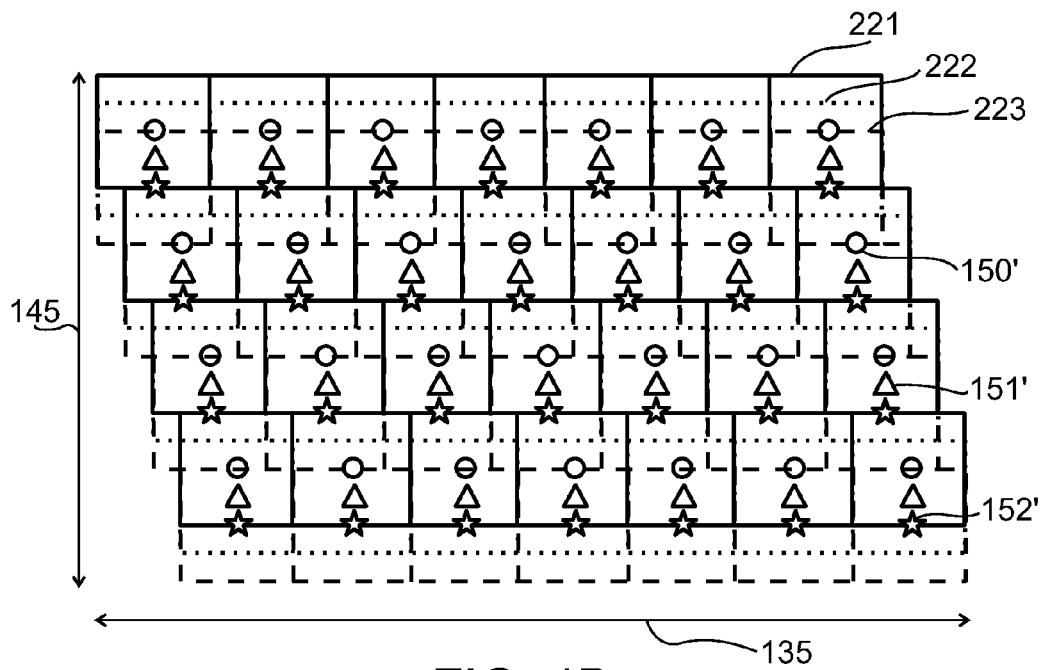

Reference is now made to FIGS. 4A and 4B showing simplified schematic diagrams comparing a known rectangular exposure pattern and a sheared exposure pattern obtained from three consecutive exposures in accordance with some embodiments of the present invention. In FIGS. 4A and 4B an exposure pattern including only 4 rows and 7 columns is shown for simplicity of illustration. According to some embodiments of the present invention, the reset interval between exposures is defined to provide overlapping between exposed areas in the scanning direction 145 as described above in reference to FIG. 3.

In FIGS. 4A and 4B, addressing points from each of the exposures are depicted with a different shape so that they can be differentiated. The dot shaped address points 150 and 150' correspond to first exposed image 211 and 221 respectively. The triangle shaped address points 151 and 151' correspond to second exposed image 212 and 222 respectively. The star shaped address points 152 and 152' correspond to third exposed image 213 and 223 respectively.

During scanning in column direction 145, each of images 211, 212, and 213 in FIG. 4A and each of images 221, 222, and 223 in FIG. 4B are projected on the substrate so that they partially overlap each other. Each of the images are shifted in scan direction 145 by d/n (d/4 in this case) but are unshifted in the cross-scan direction 135. In FIG. 4A, alignment of the images in the cross-scan direction results in maintaining the original cross-scan addressing resolution shown in exposure pattern 100 and no new addressing columns are added. Resolution (and addressing) is only increased in the scan direction. Optionally, the addressing resolution is increased fourfold in FIG. 4A compared to the original addressing resolution of pattern 100. In FIG. 4B, sheared addressing points from the images 221, 222, and 223 provide additional addressing columns between the columns shown in exposed pattern of FIG. 4A so that addressing in 4B is increased fourfold in the scan direction and fourfold in the cross scan direction.

Figure 5A:
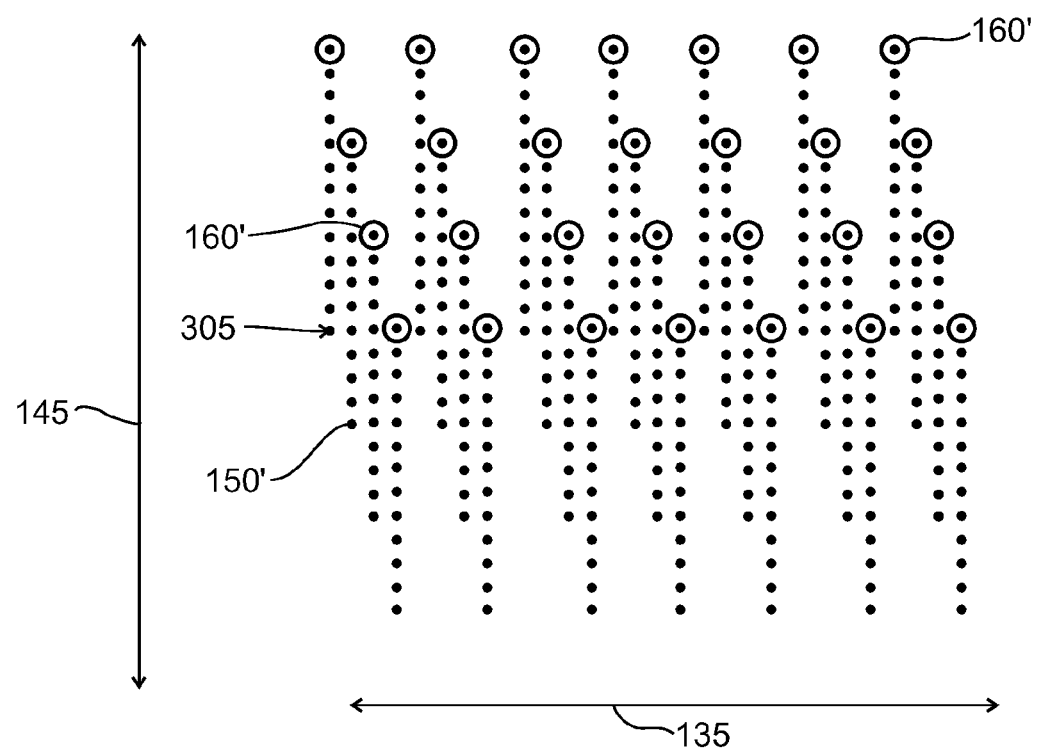
FIGS. 5A and 5B are a simplified schematic diagram showing an exemplary pattern of addressing points obtained over 13 and 39 exposures from a sheared exposure pattern in accordance with some embodiments of the present invention.

Reference is now made to FIG. 5A showing a pattern of addressing points obtained over a plurality of exposures from a sheared exposure pattern in accordance with some embodiments of the present invention. For simplicity of illustration the exposing sub-regions were omitted, and only their associated addressing points are shown. Addressing points 160' correspond to the addressing points obtained from a first image (image 221 in FIG. 4B) and addressing points 150' correspond to addressing points obtained from all subsequent image frames, e.g. images 222, 223 etc. Addressing points from 13 exposures are shown, with an exposure interval corresponding to ¼ of the dimension of sub-exposure area 120 (corresponding to one over the number of sheared portions in image 221).

Known methods for increasing the addressing resolution in the cross-scan direction 135 require repeated scanning of a same area, e.g. step and repeat method, tilting of the SLM (typically a DMD is employed) with respect to the scan direction, and/or using more than one SLM or DMD to scan a same area. Each of these known methods is associated with one or more disadvantages described above. The present inventors have found that image data arranged in a sheared matrix pattern, for example as shown in FIG. 5A, provides for increased resolution in both the cross-scan and scan direction in one continuous sweep in column direction 145 using a single DMD.

When scanning image data in a sheared matrix pattern, each set of addressing points, e.g. addressing points 160' of first image 221, are selectively shifted in the column direction 145 to print the image data over a finely resolved grid of addressing points 150' as shown in FIG. 5A. Due to this shift in the column direction, as scanning progresses in the column direction, new addressing points 150' are provided, at least initially without overwriting previous addressing points. At the 13$^{th}$ exposure, (the last one shown in FIG. 5A), a first row 305 of full cross-scan resolution is just filled.

It is noted that overwriting of addressing points does not occur in the exemplary case where the block is composed of one single row, as shown in the simplified examples of FIGS. 1B, 4B, 5A and 5B. It is noted that overwriting is typically a useful aspect of DMD printing as it is compatible with low-brightness (non-laser) light sources. In addition it allows precise control of the exposure at each point. In other exemplary embodiments and typically, a plurality of contiguous rows, e.g. 100-400 rows or 192-270 rows is shifted in a block. In such cases overwriting does occur and is dependent on the number of rows included in each block. Typically, the amount of overwriting of addressing points is inversely related to the resolution, e.g. number of addressing points, in the cross-scan direction. As the resolution in the cross-scan direction increases, overwriting of addressing points is decreased. Typically, a certain amount of overwriting is desired for example to increase and control the intensity of exposure for example when using incoherent light sources such as LED's and arc lamps in conjunction with area SLMs such as DMDs. Optionally, longer reset intervals are used to reduce and/or control the number overwriting cycles and may become useful for exposing at higher speeds. Optionally, some of the rows in each block are blanked.

Figure 5B:
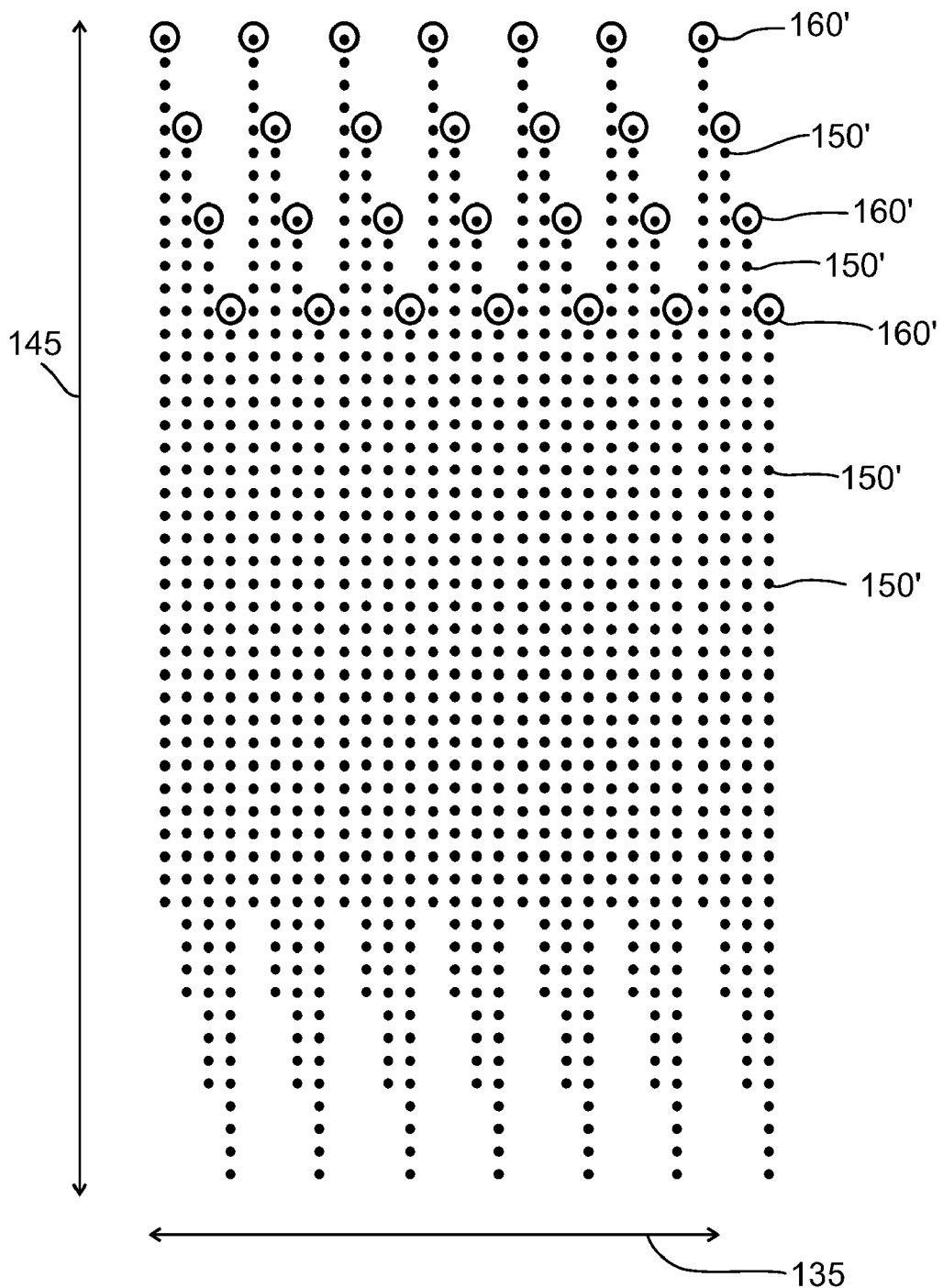

In the example shown in FIG. 5A, after 13 exposures, a first addressing row 305 is completed. FIG. 5B shows a simplified schematic diagram of addressing points obtained with cross-scan spatial shifting over additional exposures in accordance with some embodiments of the present invention. Continuing from the example shown in FIG. 5A, FIG. 5B shows addressing after 39 exposures. Each exposure after the 12$^{th}$ exposures fills in another addressing row.

An advantage of the systems and methods described herein is that since addressing points 150' are aligned with the scan direction, the swath overlap required for subsequent sweeps is minimal as compared to the swath overlap required for imaging with a tilt.

Figure 6:
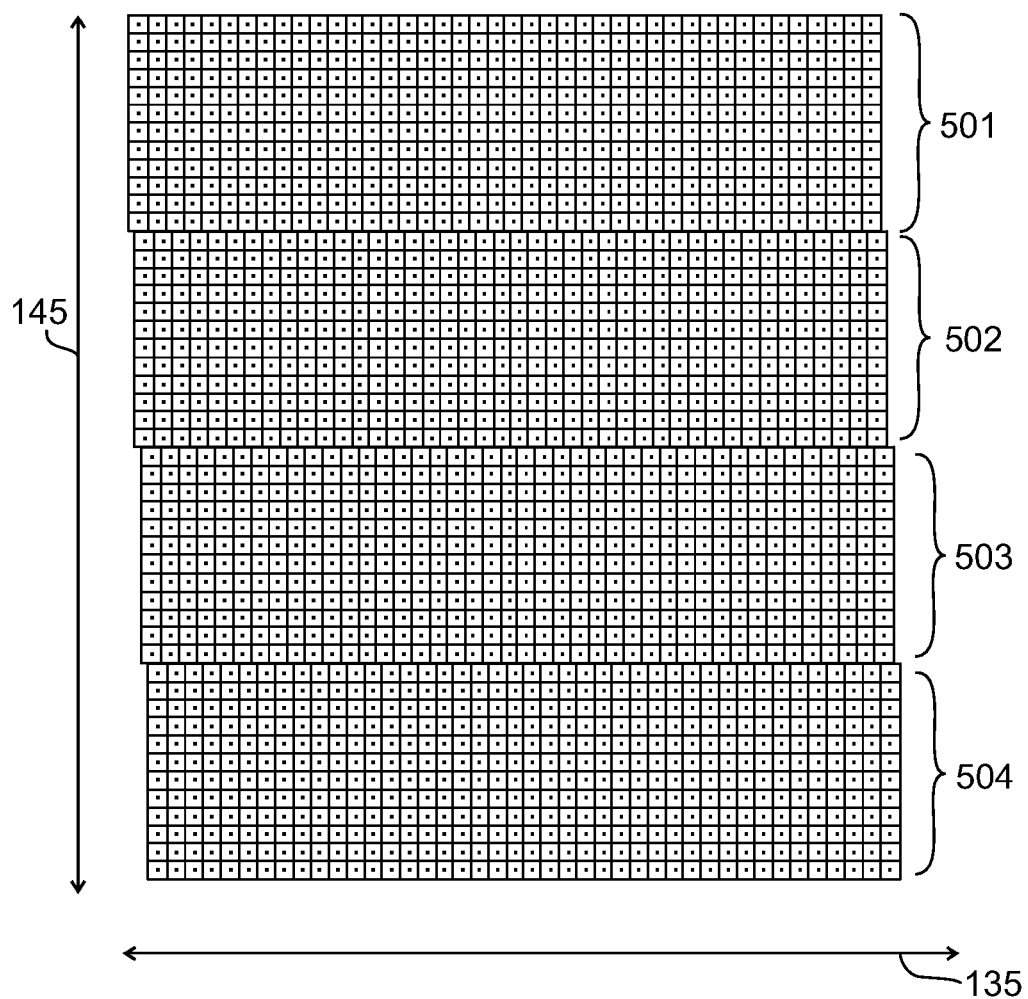
FIG. 6 is a simplified schematic diagram of writing image obtained from a SLM divided into blocks of contiguous rows that are spatially shifted with respect to each other in accordance with some embodiments of the present invention.

Reference is now made to FIG. 6 showing a simplified schematic diagram of writing image obtained from a SLM divided into blocks of contiguous rows that are spatially shifted with respect to each other in accordance with some embodiments of the present invention. Typically, a DMD type SLM includes a vast number of mirror elements, e.g. 1024× 768 elements each associated with a sub-exposure area when imaged on light sensitive surface. In some exemplary embodiments, the DMD image may be optically divided into 2-6 blocks, e.g. 4 blocks of contiguous rows, and each block typically includes a plurality of rows, e.g. 192 rows that are shifted with respect to each other.

In the simplified example shown in FIG. 6, image from a SLM is divided into blocks 501, 502, 503 and 504 and a pre-defined shift of ¼ of sub-exposure area is imposed between each of the blocks in row direction 135. In such a configuration, during scanning with a reset interval equal to the ¼ sub-exposure area shift, each addressing point is overwritten a plurality of times corresponding to the number of rows included in each block, namely 12 in the simplified example of FIG. 6. In another embodiment using the same SLM, the reset interval may be chosen as ¾ the sub-exposure area, in which case each addressing point will be exposed 12/3 or 4 times.

It is noted that the sub-exposure areas, e.g. sub-exposure areas 120 and/or 120' may be the image of a SLM element or pixel projected through an imaging optics, and may therefore not have exactly the same shape and size as the original pixel of the SLM. Optionally, neighboring addressing points 150 and/or 150' in FIGS. 1A, 1B, 2A, 2B, 4A, 4B, 5A, 5B, and 6 are spaced apart by a distance between two adjacent pixels of the SLM multiplied by the magnification of the imaging optics.

Figure 7A:
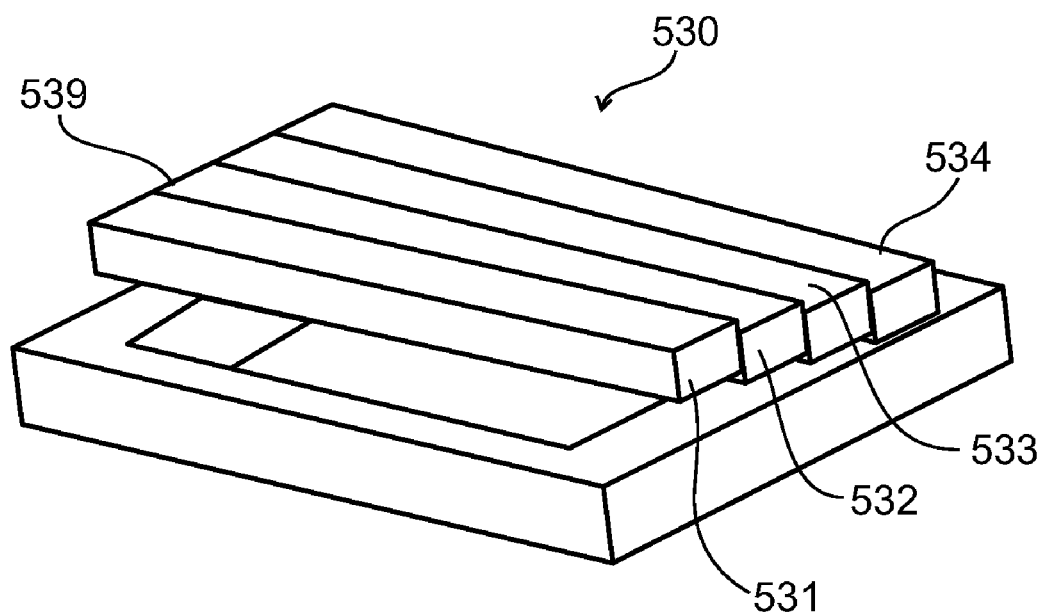
FIGS. 7A and 7B are two exemplary optical shearing elements for generating cross-scan spatial shifting of SLM data from a rectangular matrix of data in accordance with some embodiments of the present invention.
Figure 7B:
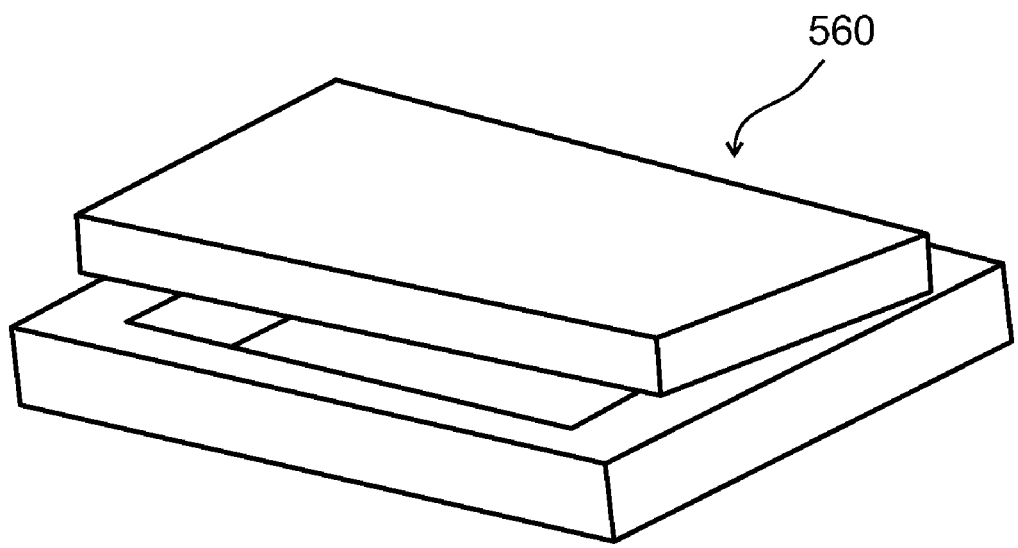
Figure 8A:
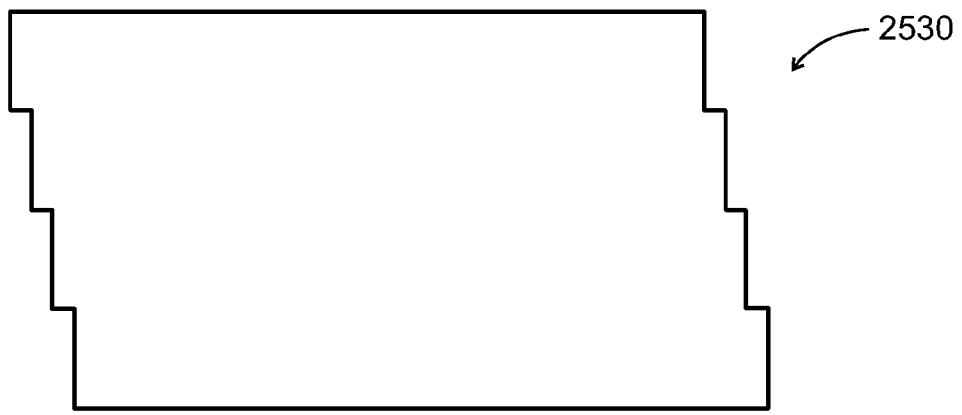
FIGS. 8A and 8B are exemplary shearing patterns obtained with the exemplary optical shearing elements shown in FIGS. 7A and 7B respectively in accordance with some embodiments of the present invention.
Figure 8B:
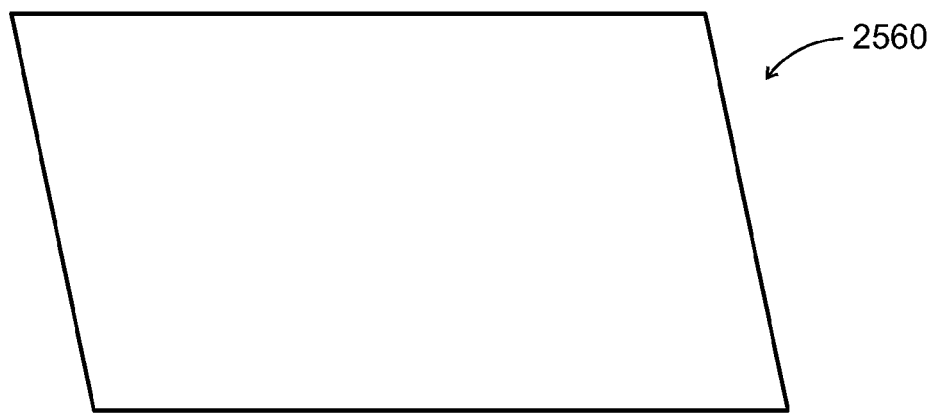

Reference is now made to FIGS. 7A and 7B showing two exemplary optical shearing elements for imposing cross-scan spatial shifting of SLM data and to FIGS. 8A and 8B showing corresponding shearing patterns obtained with the exemplary optical shearing elements shown in FIGS. 7A and 7B respectively in accordance with some embodiments of the present invention. According to some embodiments of the invention the optical shearing element 530 comprises a plurality of angled windows 531, 532, 533, 544. Each of these windows is angled with a dedicated angle to shift a portion of the DMD image by a fraction of a sub-exposure area in the row direction as described above. According to some embodiments of the present invention, a rectangular DMD image is sheared to obtain a sheared DMD image shape 2530 (FIG. 8A) using optical shearing element 530. For purposes of illustration both the tilt angles depicted in FIG. 7A and the amount of shearing in FIG. 8A are much exaggerated. Typically, the tilt angles may hardly be noticeable visually.

The number and size of each of the angled windows correspond to the number of shifted portions desired and the size of each portion. In some exemplary embodiments, angled windows 531-534 meet at a common edge 539. In other exemplary embodiments, the top surfaces of the angled windows meet at a common line along the mid-length of each surface. When the surfaces meet at a common line along the mid-length of each surface, the differences in height between the different surfaces is reduced and their misalignment with a focal plane due to the differences in height is also reduced.

In some exemplary embodiments, the optical element is constructed from adjacent slabs of birefringent material. Optionally, the optical element is similar to element 50 showing in FIG. 7 of incorporated US Pat. Appl. 2006/0060798 referenced above. Typically, shifting of the image data is provided by refraction through the optical elements.

In some exemplary embodiments, the destination of portions of an image falling close to the edges of discrete surfaces 531-534 is ambiguous. In some exemplary embodiments, the ambiguity is a result of vignetting, tolerances of optical shearing element 530 and/or due to obstruction from variance in height between the surfaces. In some exemplary embodiments, the ambiguity is avoided by blanking sub-exposure areas that fall close to the edges of the surfaces.

Referring now to FIG. 7B and FIG. 8B, in some exemplary embodiments, optical element 560 provides for spatial lateral shifting in a continuous manner as opposed to discrete blocks or portions. Optionally, the shape of surface 560 corresponds to a smoothed version of optical element 530 and provides for linear shearing of image data in the cross-scan direction as shown in FIG. 8B to obtain a sheared image shape 2560. It is noted that the linear shearing as shown is exaggerated for illustration purposes.

Preferably, the optical shearing element, e.g. optical shearing element 530 or optical shearing element 560 is aligned with DMD so that the shift is only in the row direction.

Figure 9A:
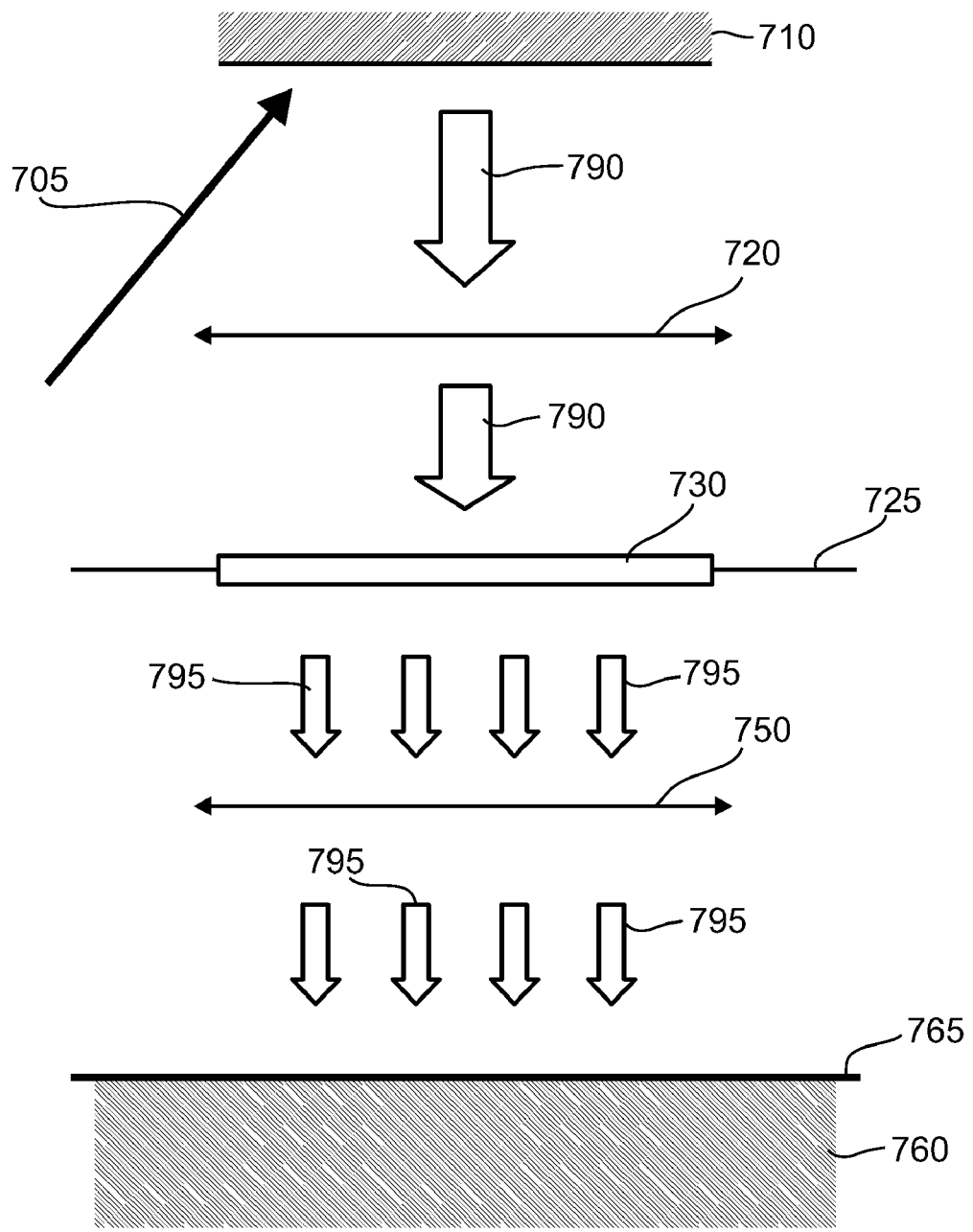
FIGS. 9A and 9B are simplified schematic diagrams of two exemplary optical systems for spatially shifting exposure data in the cross-scan direction in accordance with some embodiments of the present invention.
Figure 9B:
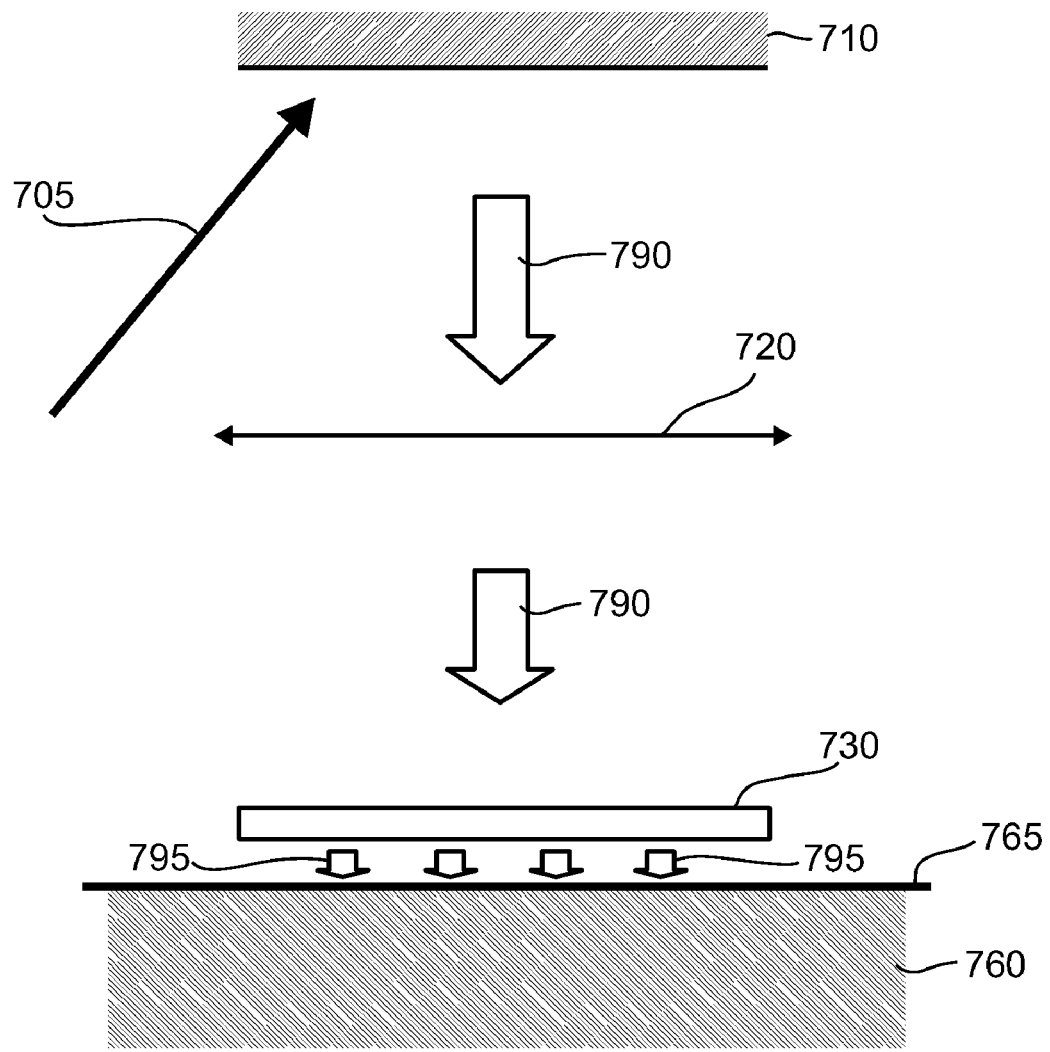

Reference is now made to FIGS. 9A and 9B showing simplified schematic diagrams of two exemplary optical systems for spatially shifting exposure data in the cross-scan direction in accordance with some embodiments of the present invention. According to some embodiments of the present invention, a spatially modulated beam 790 is formed when incident beam 705 impinges on SLM 710. In some exemplary embodiments, SLM 710 is a DMD. Optionally, beam 790 passes through an imaging system 720 that images SLM 710 onto an optical shearing element 730. Typically, beam 790 is refracted through beam shearing element 730 to shift portions of the beam with respect to each other by a pre-defined shift as described herein above.

In some exemplary embodiments, splitting element 730 is straddled on and/or around a focal plane 725 of the image of SLM 710. The present inventors have found that straddling the shearing element 730 on focal plane 725 reduces unusable parts of the SLM due to non-continuity between the different surfaces of shearing element 730. In some exemplary embodiments, straddling the beam splitting element 730 on and/or around the focal plane of the SLM reduces vignetting effects and avoids beam mixing. Optionally, primary imaging system 720 includes telecentric imaging between the SLM and the splitting element 730.

According to some embodiments of the present invention, a secondary imaging system 750 is used to focus sub-beams 795 onto a surface such as writable surface 760. Typically, secondary imaging system 750 includes an additional telecentric lens system. Typically, sub-beams 795 impinge on the writable surface substantially in a normal direction, e.g. head-on.

Referring now to FIG. 9B, in some exemplary embodiments, beam shearing element 730 is positioned in close proximity to an exposed writing surface 760 on which the SLM 710 is imaged and the secondary imaging system 750 is not required.

It is noted that although embodiments of the present invention have described spatially shifting rows of image data while scanning in the column direction, it is understood that in some embodiments of the present invention, columns of image data may be spatially shifted while scanning in the row direction using methods and systems described herein.

Figure 10:
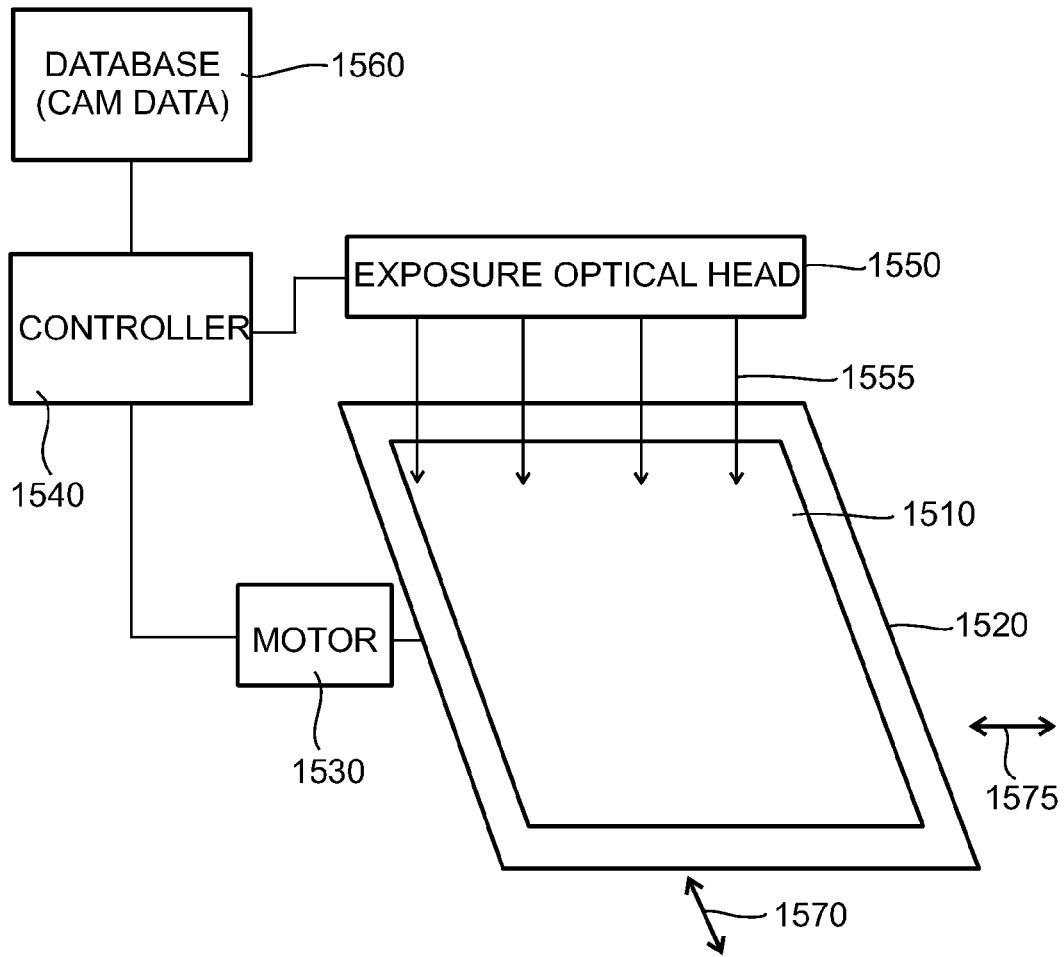
FIG. 10 is a simplified schematic diagram of a maskless lithography system for exposing a pattern on a PCB panel in accordance with some embodiments of the present invention.

Reference is now made to FIG. 10 showing a simplified schematic diagram of a maskless lithography system for exposing a pattern on a PCB panel in accordance with some embodiments of the present invention. Typically a PCB panel 1510 sits on a movable table 1520. According to some embodiments of the present invention, optical head 1550 exposes sheared image patterns on photoresist coated PCB at a pre-defined rate while motor 1530 controls movement of table 1520 in a linear scanning motion.

Typically during scanning, motion actuator/encoder 1530 controls movement of table 1520 in the scan direction 1570. Optionally, there may be provided a second motion actuator to move either the table 1520 or the optical head 1550 in the cross-scan direction 1575, e.g. for subsequent sweeps. Typically, controller 1540 adjusts the exposure rate and timing of exposure optical head 1550, e.g. the DMD reset interval, with the speed of movement of table 1520 based on the desired resolution in the scan direction. Typically, controller 1540 controls the rate for exposing images and the movement of table 1530 in accordance with a Computer Aided Manufacturing (CAM) writing data base 1560 typically stored in memory, e.g. disk files.

In some exemplary embodiments, the primary direction of movement during scanning is in the scan direction. Although motor 1530 is shown to control movement of table 1520, it is noted that table 1520 may be stationary and optical head 1550 may advance in the scan and cross-scan directions during scanning. Optionally, one or more motors control movement of both table 1520 and optical head 1550 during scanning.

According to some embodiments of the present invention, exposure optical head 1550 includes one or more incident beam sources, one or more SLMs, e.g. DMD, and one or more optical systems. Typically, the optical system includes one or more beam shearing elements to provide defined shifting of the image data in the cross-scan direction.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

What is claimed is:

1. A method of exposing a light pattern on a surface of light sensitive material, the method comprising:
   a spatial light modulator spatially modulating light beam to form a rectangular matrix exposure pattern of rows and columns of image data, wherein the rectangular matrix exposure pattern comprises contiguous sub-exposure areas, each sub-exposure area associated with a datum of the image data;
   wherein the columns of the rectangular matrix exposure pattern are aligned with a scan direction and the rows of the rectangular matrix pattern are aligned with a cross-scan direction;
   an optical shearing element modifying light output from the spatial light modulator, such that at least a first block of the exposure pattern is shifted with respect to at least a second block of the exposure pattern in a cross scan direction by an amount less than a center to center distance between two sub-exposure areas in a cross scan direction, transforming the rectangular matrix exposure pattern into a sheared exposure pattern;

exposing the surface of light sensitive material in the scan direction with the light beam output from the optical shearing element, such that the surface of light sensitive material is exposed with the sheared exposure pattern; and overlapping exposed sub-areas in the cross scan direction as a result of the scanning.

2. The method according to claim 1, wherein the contiguous sub-exposure areas form a continuously exposed area with no spacing in between.

3. The method according to claim 1, wherein the optical shearing element modifying light comprises shifting each of a plurality of blocks of the light with respect to each other, each block comprising contiguous rows of image data.

4. The method according to claim 3, wherein the optical shearing element modifying light further comprises shifting each of the blocks of light with respect to each other by a distance defined as 1/n of the center to center distance between contiguous sub-exposure areas, wherein 'n' is the number of blocks.

5. The method according to claim 1, wherein the optical shearing element modifying light defines a resolution in a cross-scan direction.

6. The method according to claim 1, wherein the surface is exposed with Cartesian addressing.

7. The method according to claim 1, wherein the spatial light modulator is formed from a single Digital Micro-Mirror Device.

8. The method according to claim 1, wherein a reset interval is defined as a non-integer multiple of a dimension of an area exposed by a sub exposure area of the rectangular matrix exposure pattern.

9. The method according to claim 8, wherein the reset interval is defined to match a resolution provided in a cross-scan direction.

10. The method according to claim 1, wherein exposing includes writing.

11. A system for exposing a light pattern on a surface of light sensitive material, the system comprising:

a scanner operative to scan a light beam over a surface of light sensitive material in a scan direction;

a spatial light modulator operative to spatially modulate a light beam to form a rectangular matrix exposure pattern of rows and columns of image data, each datum of the image data operative to expose a sub-exposure area of the surface of the light sensitive material, wherein the columns of the rectangular matrix exposure pattern are aligned with a scan direction and the rows of the rectangular matrix exposure pattern are aligned in a cross-scan direction;

an optical shearing element operative to modify light output from the spatial light modulator such that at least a first portion of the light is shifted in a cross scan direction with respect to at least a second portion of the light by an amount less than a center to center distance between two contiguous sub-exposure areas, transforming the rectangular matrix exposure pattern into a sheared exposure pattern; and an imaging system operative to scan the light beam to expose the surface of light sensitive material with the sheared exposure pattern, thus forming, on the surface, a pattern of substantially adjoining sub-exposure areas, such that sub-exposure areas exposed by the first portion of the light overlap sub-exposure areas exposed by the second portion of the light during the scanning.

12. The system according to claim 11, wherein the optical shearing element is operative to shift each of a plurality of blocks of the light with respect to each other, wherein each of the plurality of blocks comprises contiguous rows of image data.

13. The system according to claim 11, wherein each block includes 192-270 contiguous rows.

14. The system according to claim 12, wherein the optical shearing element comprises a plurality of transparent sections that are angled with respect to each other, wherein a number of transparent sections is equal to a number of the plurality of blocks, wherein each of the transparent sections is operative to shift one of the plurality of blocks.

15. The system according to claim 14, wherein each transparent section is angled to provide a shift corresponding to 1/n of a distance between contiguous addressing points, wherein 'n' is the number of blocks.

16. The system according to claim 11, wherein the optical shearing element is a warped surface operative to provide linear shearing in the row direction.

17. The system according to claim 11, wherein the optical shearing element is positioned proximal to the surface of light sensitive material.

18. The system according to claim 11, wherein the spatial light modulator is a Digital Micro-Mirror Device.

19. The system according to claim 11, comprising a controller operative to set a reset interval in response to a desired resolution in the scan direction.

20. The system according to claim 19, wherein the reset interval is defined to match a resolution provided in a cross-scan direction.

21. The system according to claim 11, wherein the scanner is operative to scan with Cartesian addressing.

22. The method according to claim 3, wherein the plurality of blocks is 2-6 blocks.

23. The system according to claim 12, wherein the plurality of blocks is 2-6 *blocks*.

* * * * *